United States Patent
Johnson, II et al.

(10) Patent No.: US 6,258,294 B1
(45) Date of Patent: Jul. 10, 2001

(54) COMPOSITION FOR STRIPPING SOLDER AND TIN FROM PRINTED CIRCUIT BOARDS

(75) Inventors: Todd Johnson, II, Tempe; John T. Fakler, Phoenix, both of AR (US)

(73) Assignee: Morton International, Inc., Chicago, IL (US)

( * ) Notice: Subject to any disclaimer, the term of this patent is extended or adjusted under 35 U.S.C. 154(b) by 0 days.

(21) Appl. No.: 08/940,125

(22) Filed: Oct. 1, 1997

(51) Int. Cl.$^7$ .................................................. C09K 13/00
(52) U.S. Cl. ............................................................ 252/79.3
(58) Field of Search .................................. 252/79.1, 79.2, 252/79.3; 427/307, 96; 216/104, 107, 109

(56) References Cited

U.S. PATENT DOCUMENTS

| | | | |
|---|---|---|---|
| 4,919,752 | 4/1990 | Mika | 156/656 |
| 5,244,539 * | 9/1993 | McGrath et al. | 156/656 |
| 5,505,872 | 4/1996 | Krulik et al. | 252/79.2 |
| 5,512,201 * | 4/1996 | Singh et al. | 242/142 |
| 5,741,432 | 4/1998 | Wong | 216/108 |
| 5,911,907 * | 6/1999 | Campbell | 252/79.1 |

FOREIGN PATENT DOCUMENTS

559379 * 9/1993 (EP) .

* cited by examiner

Primary Examiner—Brian K. Talbot

(57) ABSTRACT

A composition and method for stripping tin and solder and the underlying tin-copper alloy from the copper substrate of a printed circuit board is presented. The liquid includes an aqueous solution of nitric acid in an amount sufficient to dissolve solder and tin, a source of ferric ions in an amount sufficient to dissolve the tin-copper alloy, and a source of halide ions in an amount sufficient to significantly improve the resistance between printed circuits.

4 Claims, No Drawings

COMPOSITION FOR STRIPPING SOLDER AND TIN FROM PRINTED CIRCUIT BOARDS

FIELD OF THE INVENTION

The present invention relates generally to the removal of solder and tin films from printed circuit boards. More particularly, the present invention relates to a new and improved method and composition for stripping solder and tin films and the underlying tin-copper alloy from the copper substrate of a printed circuit board while providing the surrounding laminate with enhanced insulation resistance.

BACKGROUND OF THE INVENTION

A typical printed circuit board has a copper conductor pattern on an insulating support. Tin of solder is applied onto the copper substrate, typically by electroplating. A standard solder film is nominally 0.0003 inches thick and a standard tin film has approximately the same or slightly less thickness. After the tin/solder film is applied to the board, a thin film of copper-tin alloy forms between the copper and the film. This thin film of copper-tin alloy is typically 0.000002 to 0.000004 inches thick. The copper-tin alloy thickness increases in thickness over time.

As used in the specification and claims, the word solder includes the various low melting point alloys and elements used for electrical soldered connections and for copper etching masks or resists. The majority of such coatings comprise various tin-lead alloys, but can also include alloys containing silver, bismuth, cadmium, indium, and other metals. Such films are produced using various methods, including chemical plating, chemical deposition, chemical displacement and immersion in a melt.

In the manufacturing process, the tin or solder film is stripped from the copper substrate. Generally, two types of compositions have been generally used in the past for tin and solder stripping. The most widely used prior compositions were based on an acid solution containing hydrogen peroxide and fluoride. In recent years, formulations based on nitric acid solutions containing ferric ions have become widely used commercially.

The prior art peroxide-fluoride solutions are undesirable because there is an exothermic reaction during stripping which heats the solution to a temperature which decomposes the unstable peroxide and makes the solution unusable. Hence, the solution requires cooling during use. Also, the peroxide-fluoride solutions are slower in operation than the nitric acid solutions.

Nitric acid solutions eliminate the problems associated with the peroxide-fluoride solutions. Early nitric acid based solutions comprised a two-solution system. The first acidic solution contained nitric acid to strip the tin or solder. The second acidic solution contained ferric chloride, ammonium persulfate, a mixture of sulfuric acid and hydrogen peroxide, or an acidic peroxide-fluoride mixture to dissolve the tin-copper alloy.

Further, the basic compositions and methods for single bath and spray nitric acid/ferric stripping are now well described in prior art patents. For example, the composition of U.S. Pat. No. 4,713,144 utilizes a combination of nitric, ferric, and sulfamic acid which quickly strips both the tin/solder film and the tin-copper alloy while leaving the copper surface bright, shiny and uniform.

Printed circuits in the telecommunications industry must have extremely high resistance insulating materials between the printed circuits to prevent the electrical signals from crossing over to adjoining circuits. The cross-over of electrical signals to adjoining circuits which can result from a low insulation resistance can cause, among other things, the ability to hear another person's phone conversation when you are using a phone.

Incomplete copper stripping or etching as well as the presence of a wide variety of metal species or other contaminants left on the printed circuit board after tin or solder stripping can result in a relatively low insulation resistance. Current nitric acid/ferric solutions are not formulated to maximize the insulation resistance between printed circuit traces.

Accordingly, it is an object of the present invention to provide a new and improved stripping composition and method of stripping tin or solder which provides the printed circuit board with enhanced insulation resistance.

This and other objects, advantages, features and results of the present invention will more fully appear in the course of the following description.

SUMMARY OF THE INVENTION

It is a principal object of the present invention to provide a metal-dissolving liquid for stripping tin or solder and the underlying tin-copper alloy from the copper substrate of a printed circuit board.

It is another object of the present invention to provide a stripping composition and method of stripping tin or solder which provides the printed circuit board with enhanced insulation resistance.

It is still another object of the present invention to provide an aqueous solution that can be directly sprayed onto a circuit board to strip tin or solder and the underlying tin-copper alloy from the copper substrate of a printed circuit board.

In brief, the composition of the present invention for removing tin and solder and the underlying tin-copper alloy from the copper substrate of a printed circuit board includes an aqueous solution of nitric acid in an amount sufficient to dissolve solder, ferric ion in an amount sufficient to dissolve tin-copper alloy, and halide ions in an amount to significantly improve the insulation resistance of the printed circuit board. More specifically, the liquid composition of the present invention consists essentially of an aqueous solution of 5 to 50 percent by volume of 69% by weight nitric acid aqueous solution, 1 to 50 percent by volume of 45% by weight ferric nitrate, 0.1% by weight to saturation of halide ions, and the balance water.

DESCRIPTION OF THE PREFERRED EMBODIMENTS

The composition of the present invention is an aqueous solution with nitric acid, ferric nitrate, and a source of halide ions as essential ingredients.

It is known that nitric acid will dissolve tin or solder. It is also known that ferric nitrate will dissolve copper and tin-copper alloys. Further, it is known that acidic peroxide-fluoride tin and/or solder strippers provide improved insulation resistance over nitric acid based tin and/or solder strippers. It is not known that the act of combining nitric acid, ferric nitrate, and halide ions in a single formulation will result in the creation of a nitric acid based stripping solution capable of providing enhanced insulation resistance to printed circuits. The composition of the invention in the ranges set forth in the following paragraphs produces the desired reactions in the desired sequence to achieve the desired stripping result.

The metal-dissolving liquid consists essentially of an aqueous solution of nitric acid in an amount sufficient to dissolve tin and/or solder, ferric nitrate in an amount sufficient to dissolve tin-copper alloy, and a source of halide ions in an amount sufficient to remove metal and other contaminants from the circuit board thereby substantially improving the printed circuits insulation resistance.

For practical purposes, the concentration of nitric acid must be limited on the high end to avoid possible damage to printed circuit board substrates and to the equipment in which the tin or solder stripping solutions are used. It has been found that there is no practical need to exceed concentrations of nitric acid higher than about 50 percent by volume of 69% by weight nitric acid. Concentrations considerably less than 40 percent by volume yield useful tin/solder stripping solutions.

The concentration of nitric acid is limited on the low end by the time that may be allotted for the solder stripping operation, and by the total amount of solder a given volume of solder stripping solution may be expected to strip before it becomes spent. If neither of these considerations is of importance, the nitric acid content can be as low as 5 percent by volume of 69% by weight nitric acid or less and still effectively strip tin and/or solder from copper.

Nevertheless, the concentration of nitric acid is an important factor in determining the rate at which the solder is stripped. For example, If the economic factors dictate that approximately 0.0003 inches thick electroplated solder is to be consistently stripped in less than one minute at 80° F., the concentration of nitric acid should be at least about 10 percent by volume of 69% by weight nitric acid provided that the ferric nitrate concentration is about 5 percent by volume of 45% by weight ferric nitrate. The porosity of metal to be removed, the thickness of the metal and its position on the board, and the age of the board are all factors which affect the time required to clean the board.

A concentration of 45% ferric nitrate of 17 percent by volume with nitric acid in the range of about 15 to 20 percent by volume of 69% by weight nitric acid at room temperature or slightly above room temperature will yield a solution that can strip a typical 0.0003 inches thick film of electroplated solder and remove the intermetallic tin-copper alloy layer in about one half minute. Lower concentrations of ferric nitrate result in more time required to strip the solder and remove the intermetallic layer while higher concentrations can reduce the time to as little as 15 to 20 seconds.

The compositions contemplated in this patent application are aqueous solutions of ferric nitrate, nitric acid and halide ions.

Ferric nitrate can be obtained commercially as crystals of $Fe(NO_3)_3 + 9H_2O$ and as an aqueous solution containing 45% by weight of anhydrous $Fe(NO_3)_3$. The concentration of ferric nitrate in the subject compositions may be expressed as grams per liter of $Fe(NO_3)_3 + 9H_2O$, weight percent of $Fe(NO_3)_3 + 9H_2O$, grams anhydrous $Fe(NO_3)_3$, weight percent anhydrous $Fe(NO_3)_3$ or as a volume percent of the 45% $Fe(NO_3)_3$ aqueous solution. For simplicity purposes, expression of the ferric nitrate concentration as a volume percent of 45% $Fe(NO_3)_3$ aqueous solution is preferred.

Nitric acid is commercially available as a 69% by weight aqueous solution of $HNO_3$. Again, for ease of preparation, the nitric acid content is best expressed as percent by volume percent of a 69% nitric acid solution.

Halide ions are sold commercially in a variety of aqueous acids and salts and as various powder and flake salts.

In the following examples and patent claims, the amount of nitric acid is expressed in terms of 69% nitric acid and the amount of ferric nitrate is expressed in terms of 45% ferric nitrate. These particular combinations have been used because these materials are commonly sold and used in such concentrations. However, it will be recognized by those skilled in the art that other concentrations, including the anhydrous state, can be used if desired, and that the figures stated for the compositions can readily be converted to other figures for other concentrations.

The preferred ranges for the three functional components of the stripper are:

Nitric Acid- about 5–50 percent by volume of 69% nitric acid aqueous solution,

Ferric Nitrate- about 1 to 50 percent by volume of 45% ferric nitrate aqueous solution, and Halide Ion- about 0.1 percent by weight to saturation, with the balance water.

The more preferred ranges are:

Nitric Acid- about 10 to 35 percent by volume of 69% nitric acid aqueous solution, Ferric Nitrate- about 5 to 25 percent by volume of 45% ferric nitrate aqueous solution, and Halide Ion- about 0.1 percent to 10 percent by weight, with the balance water.

The presently preferred specific composition range is:

Nitric Acid- about 15 to 30 percent by volume of 69% nitric acid aqueous solution, Ferric Nitrate- about 15 to 20 percent by volume of 45% ferric nitrate aqueous solution, and Halide Ion- about 0.5 percent to 5 percent by weight, with the balance water.

Specific examples of compositions and their operation are set out in the following examples. Each example is an aqueous solution of at least two of the three functional components along with a small amount of sulfamic acid to suppress copper attack, and a balance of water. Alternative forms of copper attack suppression are well known in the art. The composition was applied in each instance by immersion with agitation of the printed circuit board at a temperature of 80° F. to 90° F.

Test Procedure

Tests were conducted by immersion-etching samples of solder plated printed circuit boards imaged with Bellcore spec #. After immersion-etching the sample boards were rinsed with deionized water and dried for 5 minutes at 175° F. The sample boards were subjected to 35° C. and 85% relative humidity in a Tenny Tenny Jr. temperature/humidity chamber for 24 hours. The resistance was tested between printed circuits using the Bellcore spec# by a resistance meter capable of measuring 10E+12 ohms. The resulting insulation resistance measurements were averaged for each example.

A base solution for the examples was prepared. The base solution comprised: 19.5% of 67% nitric acid, 15.9% of 45% ferric nitrate, and 10 gram/liter sulfamic acid. In each example (except example 1) the halide compounds were added to one liter of the base solution. Further, extra sulfamic acid was added in Example 3 to show that sulfamic acid does not produce a positive effect on resistance results.

EXAMPLE FORMULATIONS & RESULTING INSULATION RESISTANCE

Example No. 1

The base solution was tested. Resistance result: 1.15E+10.

Example No. 2

50 g/L sodium bifluoride was added to the base solution. Resistance result: 6.91E+11. Conclusion: Sodium bifluoride provides a significant increase in resistance.

Example No. 3

50 g/L sodium bifluoride and 40 g/L sulfamic acid were added to the base solution. Resistance result: 5.96E+11. Conclusion: Sulfamic acid has no significant effect on resistance.

Example No. 4

46 g/L ammonium bifluoride was added to the base solution. Resistance result: 9.55E+11. Conclusion: Ammonium bifluoride provides a significant increase in resistance.

Example No. 5

59.75 g/L ammonium fluoride was added to the base solution. Resistance result: 8.80E+11. Conclusion: Ammonium fluoride provides a significant increase in resistance.

Example No. 6

63 g/L potassium bifluoride was added to the base solution. Resistance result: 9.40E+11. Conclusion: Potassium bifluoride provides a significant increase in resistance.

Example No. 7

68 g/L sodium fluoride was added to the base solution. Resistance result: 8.46E+11. Conclusion: Sodium fluoride provides a significant increase in resistance.

Example No. 8

46 g/L potassium fluoride was added to the base solution. Resistance result: 1.71E+11. Conclusion: Potassium fluoride provides a significant increase in resistance.

Example No. 9

68 mls/L of a 48% by weight aqueous hydrofluoridic acid was added to the base solution. Resistance result: 9.95E+11. Conclusion: Hydrofluoric acid provides a significant increase in resistance.

Example No. 10

66 mls/L of a 60% by weight aqueous hexafluorophosphoric acid was added to the base solution. Resistance result: 8.13E+11. Conclusion: Hexafluorophosphoric acid provides a significant increase in resistance.

Example No. 11

152 mls/L of a 20° Baume hydrochloric acid was added to the base solution. Resistance result: 7.04E+11. Conclusion: Hydrochloric acid provides a significant increase in resistance.

In each of the above examples, a halide ion compound added to the nitric acid stripper solution provided a significant increase in resistance of the printed circuit.

We claim:

1. A tin or solder stripping composition for providing a printed circuit board with improved insulation resistance consisting essentially of about 5–50% by volume of 69% nitric acid aqueous solution, about 1–50% by volume of 45% ferric nitrate aqueous solution, about 0.1–10% by weight of at least one fluoride ion added to the stripping solution to provide an increase in insulation resistance of the printed circuit, said fluoride ion being selected from the group consisting of sodium fluoride, sodium bifluoride, potassium fluoride and potassium bifluoride and mixtures thereof.

2. The composition of claim 1 wherein said fluoride ion comprises about 0.1 percent by weight of said composition.

3. The composition of claim 1 wherein said nitric acid aqueous solution comprises a range of about 10 to 35 percent by volume of said composition and said ferric nitrate aqueous solution comprises a range of about 5 to 25 percent by volume of said composition.

4. The composition of claim 1 wherein said nitric acid aqueous solution comprises a range of about 15 to 30 percent by volume of said composition and said ferric nitrate aqueous solution comprises a range of about 15 to 20 percent by volume of said composition.

* * * * *